(12) United States Patent
Solveson et al.

(10) Patent No.: US 7,145,322 B2
(45) Date of Patent: Dec. 5, 2006

(54) SELF-POWERED POWER BUS SENSOR EMPLOYING WIRELESS COMMUNICATION

(75) Inventors: Mark G. Solveson, Oconomowoc, WI (US); Charles J. Luebke, Sussex, WI (US); Joseph C. Engel, Monroeville, PA (US)

(73) Assignee: Eaton Corporation, Cleveland, OH (US)

( * ) Notice: Subject to any disclaimer, the term of this patent is extended or adjusted under 35 U.S.C. 154(b) by 74 days.

(21) Appl. No.: 10/962,682

(22) Filed: Oct. 12, 2004

(65) Prior Publication Data

US 2006/0076838 A1 Apr. 13, 2006

(51) Int. Cl.
 *G01R 15/18* (2006.01)
 *G01R 15/20* (2006.01)
(52) U.S. Cl. ............... 324/127; 324/117 H; 324/117 R
(58) Field of Classification Search ............. 324/117 H
 See application file for complete search history.

(56) References Cited

U.S. PATENT DOCUMENTS

| | | | |
|---|---|---|---|
| 4,587,509 A | 5/1986 | Pitt et al. | |
| 4,616,207 A | 10/1986 | Knapp, Jr. et al. | |
| 4,855,671 A * | 8/1989 | Fernandes | 324/127 |
| 5,349,162 A | 9/1994 | Holling | |
| 5,565,783 A * | 10/1996 | Lau et al. | 324/522 |
| 6,043,461 A | 3/2000 | Holling et al. | |
| 6,084,522 A | 7/2000 | Addy | |
| 6,087,800 A * | 7/2000 | Becker et al. | 318/778 |
| 6,130,599 A | 10/2000 | Juds et al. | |
| 6,271,656 B1 | 8/2001 | Juds et al. | |
| 6,628,496 B1 | 9/2003 | Montjean | |
| 6,642,704 B1 * | 11/2003 | Hastings et al. | 324/117 H |
| 6,731,105 B1 | 5/2004 | Hoyle et al. | |
| 7,053,601 B1 * | 5/2006 | Fenske et al. | 324/127 |

OTHER PUBLICATIONS

National Semiconductor Corporation, "LM35 Precision Centigrade Temperature Sensors", Nov. 2000, pp. 1-13.

* cited by examiner

*Primary Examiner*—Paresh Patel
*Assistant Examiner*—Roberto Velez
(74) *Attorney, Agent, or Firm*—Martin J. Moran (57) ABSTRACT

A sensor apparatus for a power bus including a current and a temperature includes a housing and one or more sensors. Each of the sensors is adapted to sense one of the current or the temperature of the power bus. A radio transceiver circuit is adapted to transmit a first wireless signal and to receive a second wireless signal. A processor is adapted to input the sensed current and the sensed temperature from the sensors and to output corresponding signals to the radio transceiver circuit in order to transmit the first wireless signal. A power supply is adapted to employ voltage produced by magnetically coupling the power bus to one or more coils, in order to power the sensors, the radio transceiver circuit and the processor from flux arising from current flowing in the power bus.

21 Claims, 8 Drawing Sheets

SELF-POWERED POWER BUS SENSOR EMPLOYING WIRELESS COMMUNICATION

BACKGROUND OF THE INVENTION

1. Field of the Invention

This invention pertains generally to sensors for switchgear and, more particularly, to such sensors for a power bus.

2. Background Information

Electrical sensors of various types are used to detect the current flowing through a conductor. Such sensors include, for example, a single Hall effect sensor that produces an output voltage indicative of the current magnitude as well as more conventional current sensors such as a shunt resistor.

Hall effect devices have been used to sense variations in magnetic flux resulting from a flow of current through a conductor. Some of these known devices have used a flux concentrator to concentrate magnetic flux emanating from the flow of current through the conductor. It has previously been suggested that electrical current sensing apparatus could be constructed in the manner disclosed in U.S. Pat. Nos. 4,587,509; and 4,616,207.

It is also known to measure the current in a conductor with one or two appropriately placed Hall sensors that measure flux density near the conductor and to convert the same to a signal proportional to current. See, for example, U.S. Pat. Nos. 6,130,599; 6,271,656; 6,642,704; and 6,731,105.

Non-conventional current sensors that employ a pair of magnetic field detectors have special requirements. One of these requirements is that the magnetic field detectors are parallel to one another. Another requirement may be that the corresponding electronic circuit card is disposed as closely as possible to the magnetic field detectors for purposes such as packaging, convenience and noise suppression. Furthermore, it may be advantageous to provide a current sensor assembly that can be mounted to conductors having various sizes and shapes.

U.S. Pat. No. 6,642,704 discloses a current sensor assembly that maintains a pair of magnetic field detectors parallel to one another and closely disposed to an electronic circuit card. Furthermore, the magnetic field detectors are selectively adjustable in order to be attached to a variety of electrical power conductors.

There exists the need for switchgear devices to safely provide electrical isolation and reliably determine, for example, the temperature and/or the current of the power busses thereof.

Accordingly, there is room for improvement in sensors for switchgear or power busses.

SUMMARY OF THE INVENTION

These needs and others are met by the present invention, which provides a self-powered power bus sensor that employs wireless communication for electrical isolation.

In accordance with one aspect of the invention, a sensor apparatus for a power bus including a plurality of characteristics comprises: a housing; at least one sensor, each of the at least one sensor being adapted to sense a characteristic of the power bus; a circuit adapted to at least transmit a wireless signal; a processor adapted to input the sensed characteristic from the at least one sensor and to output a corresponding signal to the circuit in order to transmit the wireless signal; and a power supply adapted to couple the housing to the power bus and to power the at least one sensor, the circuit and the processor from flux arising from current flowing in the power bus.

The power supply may comprise two coils each of which has an opening, a ferrite core having two ends, and a magnetic flux concentrator member having two ends, the ferrite core being passed through the openings of the coils, each of the ends of the magnetic flux concentrator member engaging a corresponding one of the ends of the ferrite core. The ferrite core and the magnetic flux concentrator member may be adapted to encircle and capture the power bus.

Each of the coils may include a winding which is electrically connected in series with the winding of the other one of the coils, the series electrically connected windings of the coils outputting a first voltage. The power supply may further comprise means for generating at least one second voltage from the first voltage to power the at least one sensor, the circuit and the processor.

The power bus may further include a generally planar surface, and the magnetic flux concentrator member may be adapted to hold the coils against or proximate to the generally planar surface of the power bus.

The generally planar surface of the power bus may have a first end and an opposite second end. The power supply may further comprise a spacer having an opening through which the ferrite core passes, the spacer being between the coils, each of the coils being adapted to be proximate one of the first end and the opposite second end of the generally planar surface.

The processor may comprise a low-power mode and a routine adapted to wake up from the low-power mode, to input the sensed characteristic of the power bus, to prepare a message to output as the corresponding signal to the circuit, and to sleep in the low-power mode.

BRIEF DESCRIPTION OF THE DRAWINGS

A full understanding of the invention can be gained from the following description of the preferred embodiments when read in conjunction with the accompanying drawings in which.

DESCRIPTION OF THE PREFERRED EMBODIMENTS

As employed herein the term "antenna" shall expressly include, but not be limited by, any structure adapted to radiate and/or to receive electromagnetic waves, such as, for example, radio frequency signals.

As employed herein the term "switchgear device" shall expressly include, but not be limited by, a circuit interrupter, such as a circuit breaker (e.g., without limitation, low-voltage or medium-voltage or high-voltage); a motor controller/starter; and/or any suitable device which carries or transfers current from one place to another.

As employed herein the term "power bus" shall expressly include, but not be limited by, a power conductor; a power bus bar; and/or a power bus structure for a circuit interrupter.

As employed herein, the term "wireless" means without a wire, without an electrical conductor and without an optical fiber or waveguide.

As employed herein, the term "wireless signal" means a radio frequency signal, an infrared signal or another suitable visible or invisible light signal that is transmitted and/or received without a wire, without an electrical conductor and without an optical fiber or waveguide.

As employed herein, the term "low-rate wireless signal" means IrDA, Bluetooth, and other suitable radio frequency, infrared, or other light, wireless communication protocols or wireless signals.

As employed herein, the statement that two or more parts are "connected" or "coupled" together shall mean that the parts are joined together either directly or joined through one or more intermediate parts. Further, as employed herein, the statement that two or more parts are "attached" shall mean that the parts are joined together directly.

The present invention is described in association with a temperature sensor and/or a current sensor for a power bus bar, although the invention is applicable to a wide range of sensors for power busses.

Figure 1:
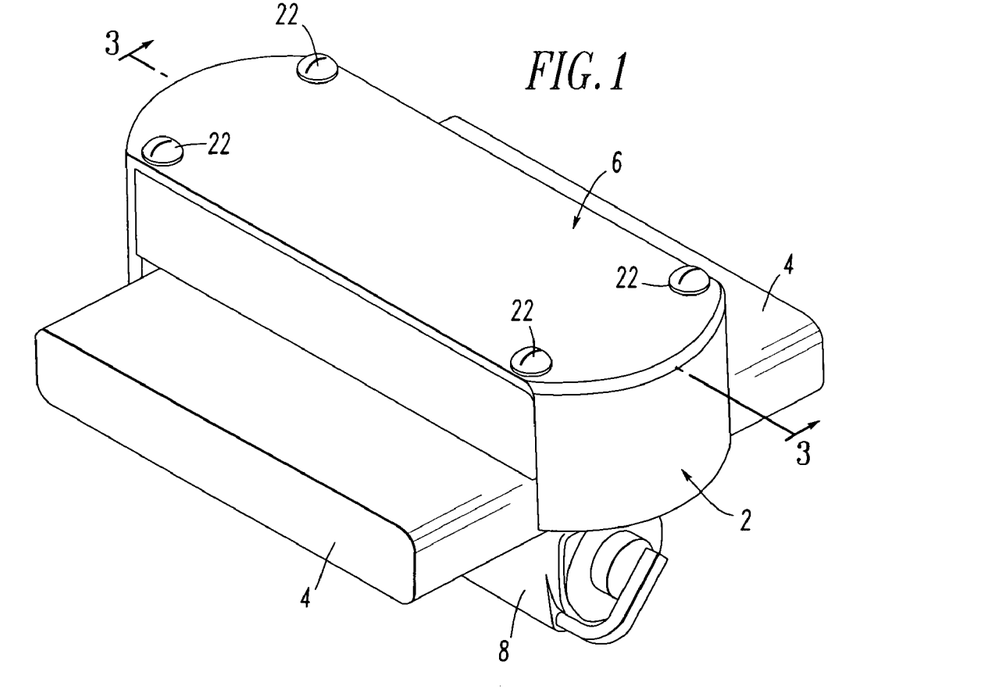
FIG. 1 is an isometric view of a self-powered wireless power bus temperature sensor in accordance with the present invention.
Figure 2:
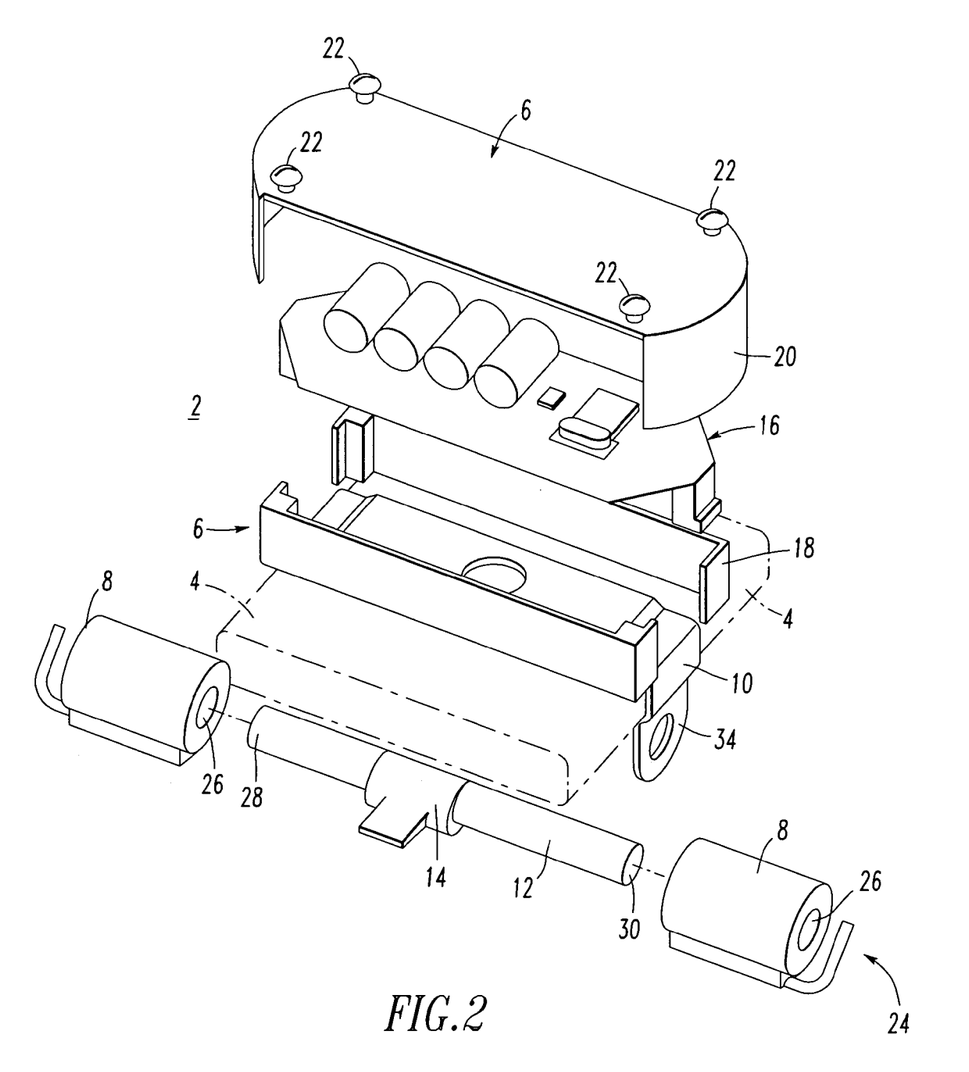
FIG. 2 is an exploded isometric view of the temperature sensor of FIG. 1.
Figure 3:
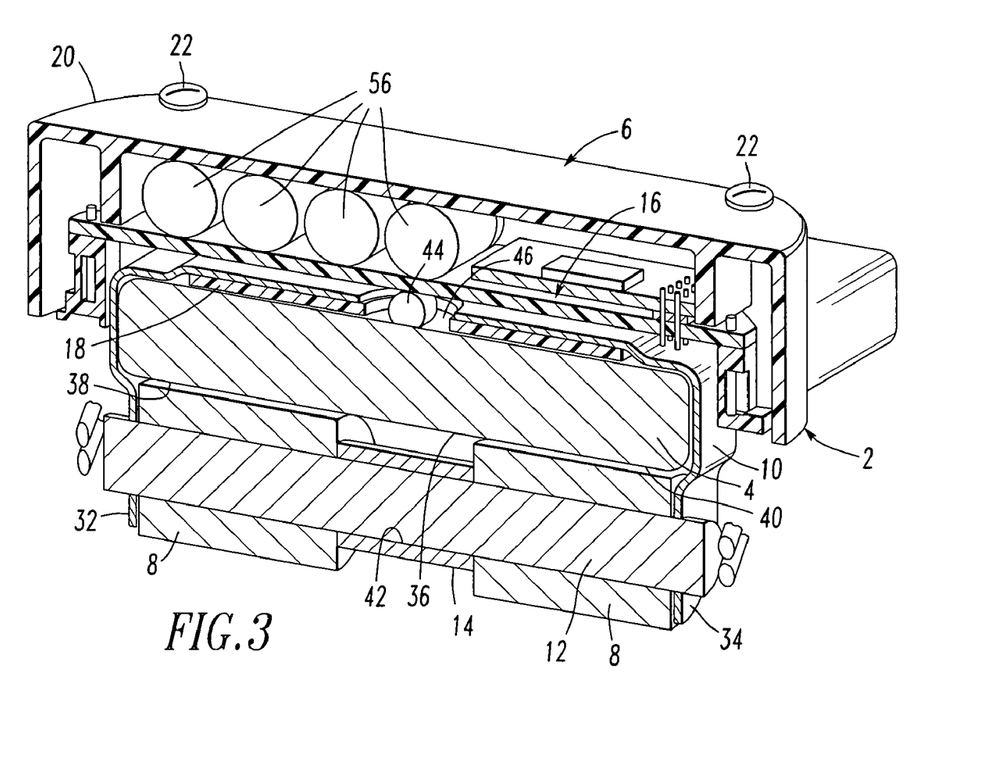
FIG. 3 is a cross sectional view along lines 3—3 of FIG. 1.
Figure 5:
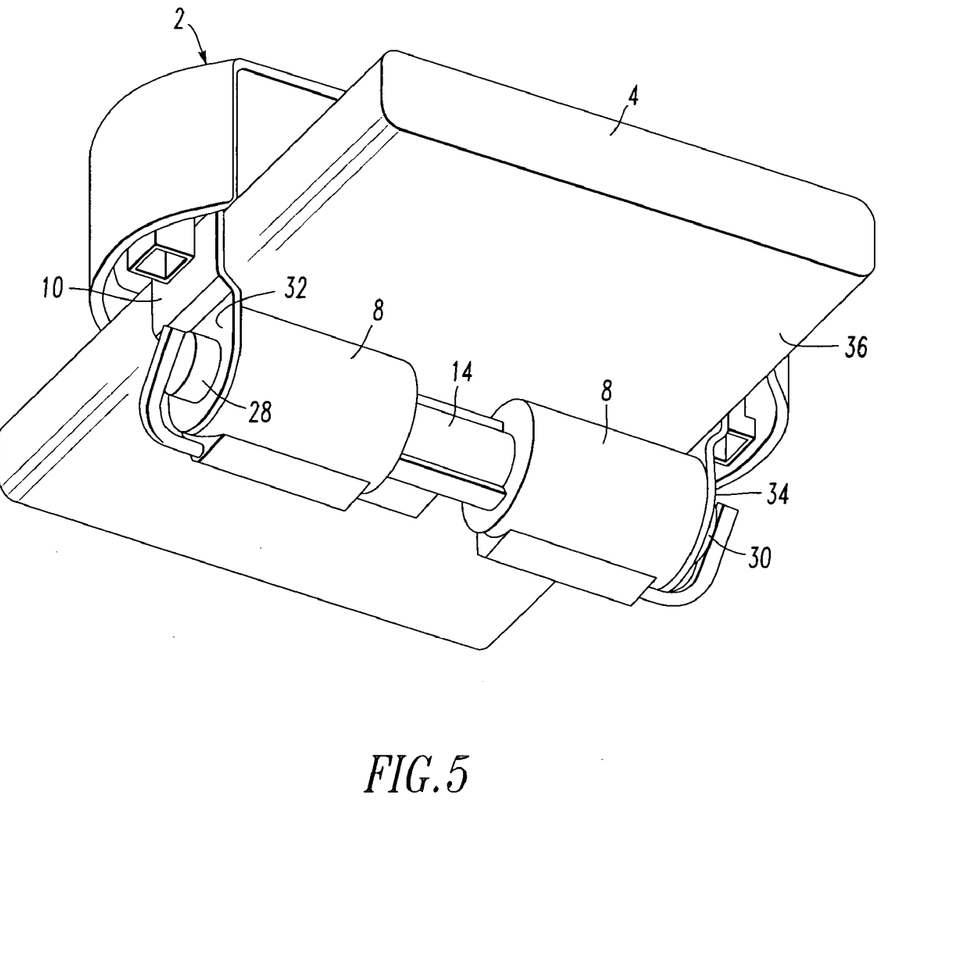
FIG. 5 is an isometric view of the temperature sensor and the two bus coils of FIG. 2.

Referring to FIG. 1, a self-powered wireless power bus temperature sensor device 2 is disposed about a power bus bar 4. The sensor device 2 includes a housing, such as an insulated enclosure 6, and two power coils 8 (only one coil 8 is shown in FIG. 1; two coils 8 are shown in FIGS. 2, 3 and 5). Alternatively, only one coil (not shown) of suitable size need be employed.

Also referring to FIG. 2, the sensor device 2 further includes a magnetic flux concentrator member 10 (e.g., made of cold rolled steel), a ferrite core 12 (e.g., made of a suitable ferrous material), an assembly clip/spacer 14, an electronics board assembly 16, an insulated case 18 (e.g., made of nylon), an insulated cover 20 (e.g., made of nylon), and four insulated screws 22 (e.g., made of nylon).

Alternatively, one or both of the magnetic flux concentrator member 10 and the ferrite core 12 need not be employed. The ferrite core 12 (e.g., magnetic, but suitably low conductivity in order to not heat up as much due to eddy currents) produces relatively lower power loss (e.g., heat) due to AC flux. Alternatively, a suitable laminated structure (e.g., as employed in transformers) may be employed.

As will be explained, below, in connection with FIGS. 3, 5 and 6, a power supply 24 is adapted to couple the housing 6 to a current carrying power bus, such as the power bus bar 4. The power supply 24 includes the two power coils 8 each of which has an opening 26, the ferrite core 12 having two ends 28,30, and the magnetic flux concentrator member 10 having two ends 32 (as shown in FIGS. 3 and 5) and 34. The ferrite core 12 passes through the openings 26 of the power coils 8. The ends 32,34 of the magnetic flux concentrator member 10 engage the respective ends 28, 30 of the ferrite core 12. The ferrite core 12 and the magnetic flux concentrator member 10 encircle and capture the power bus bar 4, with the member 10 coupling the case 18 thereto. The common ferrite core 12 and the magnetic flux concentrator member 10 further combine to act as a flux concentrator and, also, hold the sensor device 2 to the power bus bar 4 (as shown in FIGS. 3 and 5). As will be discussed below in connection with FIG. 6, the sensor device 2 uses the two flux sensing power coils 8 and the common inserted ferrite core 12 for improved magnetic flux coupling (e.g., as seen by Faraday's law, $V=IR+d\lambda/dt$, wherein $\lambda$ is flux linkage) to convert the magnetic flux from the power bus bar 4 to a usable voltage source to provide suitable input power for the power supply 24. As a result, the sensor device 2 is self-powered.

Referring to FIG. 3, the power bus bar 4 includes a generally planar surface 36. The common ferrite core 12 and the magnetic flux concentrator member 10 cooperate to hold the power coils 8 against or proximate to the generally planar surface 36. That surface 36 has a first end 38 and an opposite second end 40. The spacer 14 has an opening 42 through which the ferrite core 12 passes. The spacer 14 is disposed between the power coils 8, each of which is adapted to be proximate one of the ends 38,40 of the surface 36.

The sensor device 2 also includes a suitable temperature sensor 44 (e.g., an LM35 precision temperature sensor marketed by National Semiconductor of Santa Clara, Calif.) that is suitably thermally coupled with another generally planar surface 46 of the power bus bar 4. The output of the sensor 44 is electrically input by the electronics board assembly 16, as will be described, below, in connection with FIG. 6.

The sensor device 2 is, thus, designed to fasten itself around the power bus bar 4. This provides two benefits. First, the mechanical position of the temperature sensor 44 on the power bus bar 4 is provided. Second, a relatively better path for magnetic flux to link the power coils 8 as employed for self-power is provided.

EXAMPLE 1

The design of the sensor device 2 fits a power bus bar 4 with suitable cross sectional dimensions (e.g., without limitation, about 3.0 inches×about 0.5 inches), although a wide range of other power bus dimensions may be employed by employing suitable sizes of the flux concentrator member 10, the ferrite core 12 and the spacer 14.

EXAMPLE 2

A wide range of temperature sensors may be employed. For example, a silicon diode (not shown) may be suitably thermally coupled with or suitably disposed proximate to the surface 46 of the power bus bar 4 for heating thereby. For example, the forward voltage drop across the diode is inversely proportional to the temperature of the power bus bar 4. The forward voltage of the diode as energized by the power supply 24 is electrically input by an electronics board assembly, such as 16.

Although a silicon diode is disclosed, other forward biased PN junctions could be used, such as, for example, gallium arsenide. Alternatively, any suitable active or passive temperature measuring or sensing device (e.g., RTDs (resistive temperature detectors), various metals (e.g., copper, nickel, platinum) having resistance, voltage or current characteristics versus temperature) may be employed.

Figure 4:
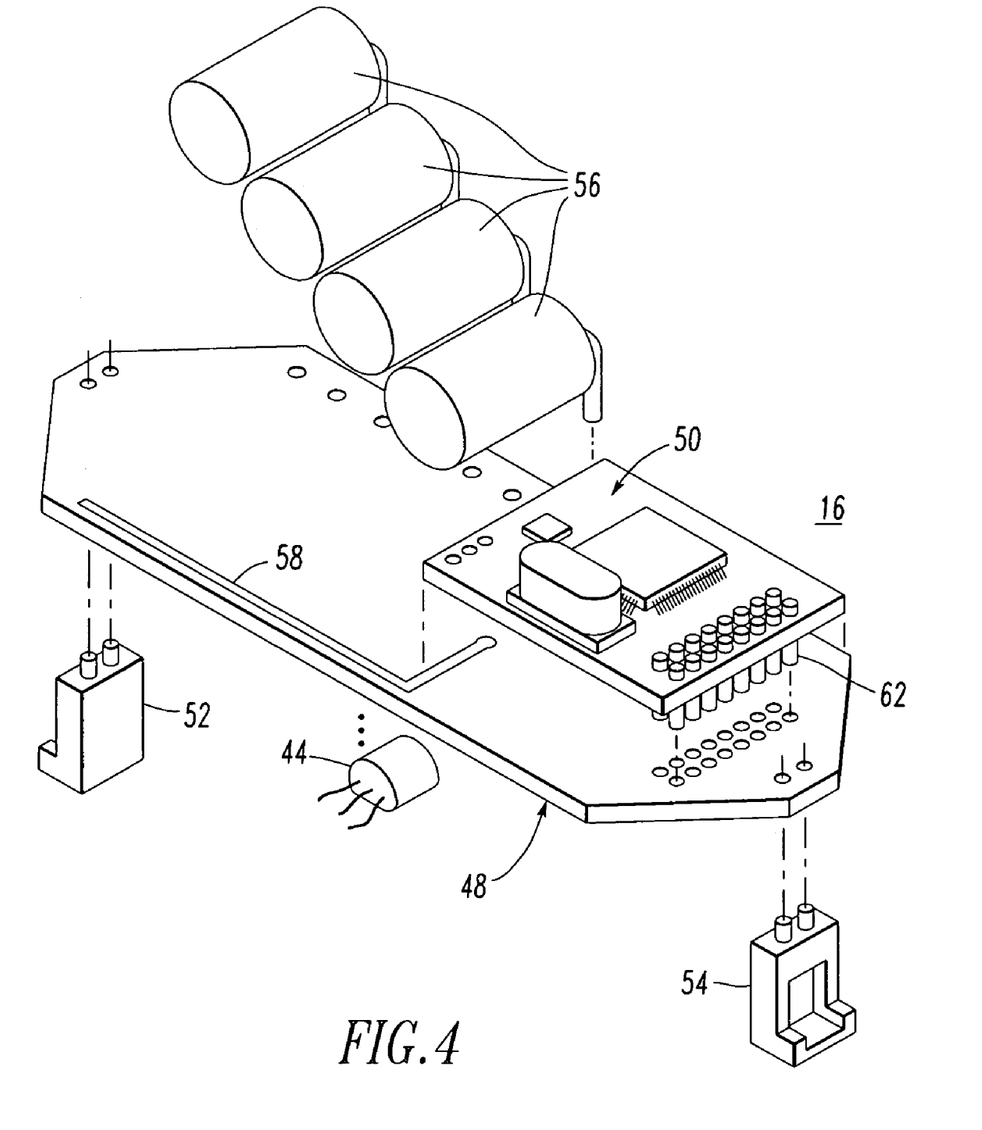
FIG. 4 is an exploded isometric view of the electronics board assembly of FIG. 2.

Referring to FIG. 4, the electronics board assembly 16 is shown. The assembly 16 includes a temperature sense printed circuit board 48, the temperature sensor 44, a radio transceiver printed circuit daughter board 50, two 2-pin board connectors 52,54, and four capacitors 56. Alternatively, any suitable bypass structure (e.g., one or more capacitors or supercaps) may be employed. The radio transceiver daughter board 50 provides wireless communication through a suitable antenna, which is a printed conductor, such as conductive trace 58, on the temperature sense printed circuit board 48.

Figure 6:
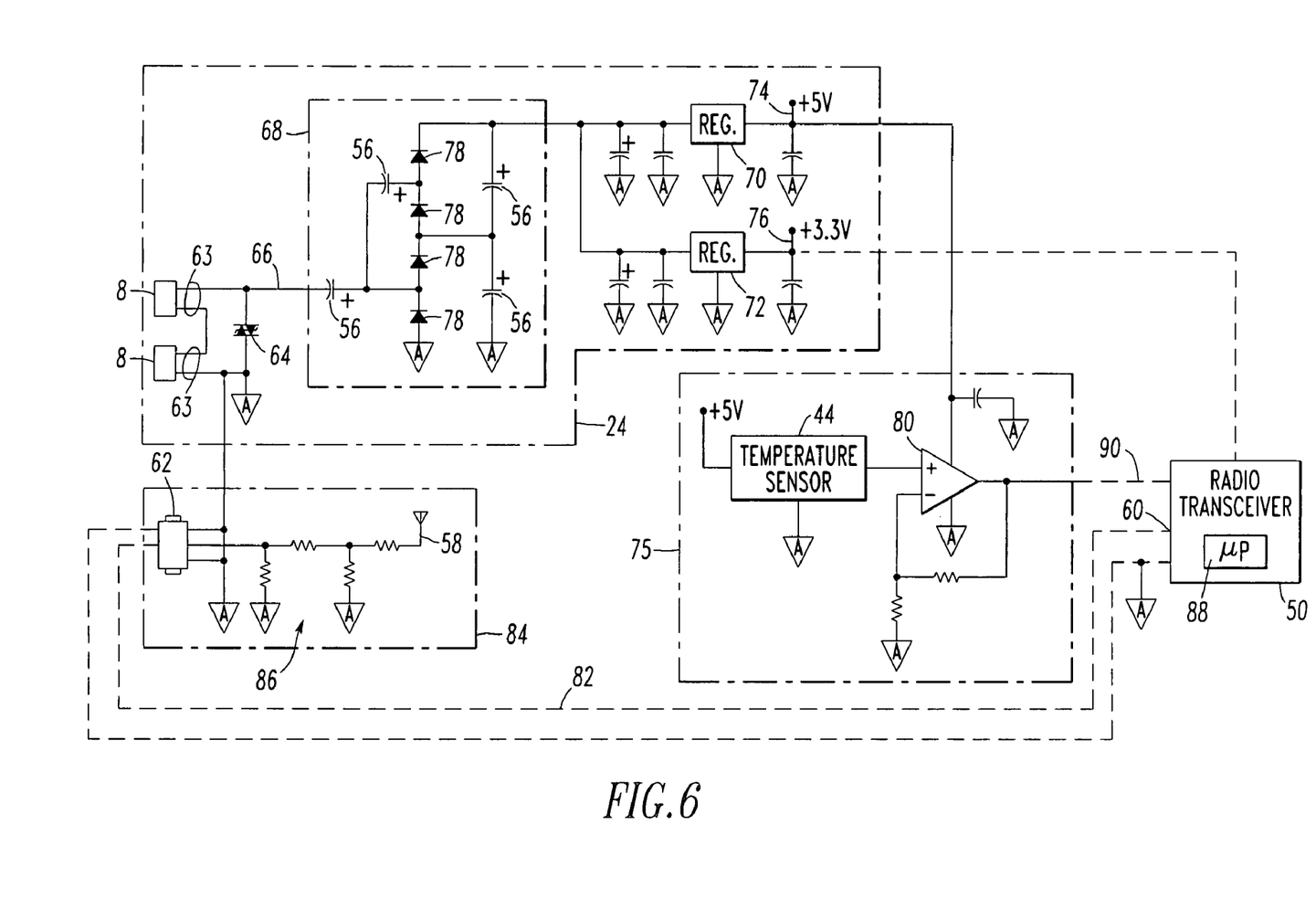
FIG. 6 is a block diagram in schematic form of the electronics board of FIG. 2.

The daughter board 50 includes an antenna output 60 (FIG. 6). The printed circuit board 48 includes a connector 62 (FIGS. 4 and 6) electrically connecting the conductive trace 58 to the antenna output 60.

EXAMPLE 3

The antenna 58 may be a printed circuit board inverted-L antenna with Gamma match. For example, the length of the antenna 58 may be designed for a quarter wave 915 MHz signal.

EXAMPLE 4

As an alternative to Example 3, any suitable antenna may be employed. A wide range of antenna types, communication distances and other frequency designs (e.g., 2.4 GHz) may be employed.

EXAMPLE 5

The radio transceiver daughter board 50 may be, for example, any suitable wireless transmitter or transceiver.

EXAMPLE 6

Although two printed circuit boards 48, 50 are shown, a single printed circuit board or other suitable circuit structure may be employed.

EXAMPLE 7

Another example of the radio transceiver daughter board 50 is a Zensys A-Wave FSK radio marketed by Zensys Inc. of Upper Saddle River, N.J.

EXAMPLE 8

Alternatively, any suitable radio circuit (e.g., without limitation, a Zigbee compatible board; a Zigbee compliant transceiver (e.g., http://www.zigbee.org); an IEEE 802.15.4 transmitter or transceiver; a radio board, a radio processor) may be employed.

EXAMPLE 9

Application programs are added to the Zensys radio board of Example 7 to provide application specific communication of temperature information from the temperature sensor 44. For example, features such as sleep mode, how often data is sent, transmit data format and the receipt of acknowledgements or requests for data may be suitably programmed.

FIG. 5 shows the temperature sensor device 2 and the two power coils 8, which are positioned on the lower (with respect to FIG. 5) side of the power bus bar 4. This allows running the flux concentrator member 10 around the power bus bar 4 for producing suitable self-power at appropriate bus current levels.

EXAMPLE 10

As a non-limiting example, at bus current levels of 400 A to 600 A, the power supply 24 of FIG. 6 may regulate +5 VDC and/or +3.3 VDC and provide 30 mA at those bus currents, although relatively lower (e.g., 50 A) or relatively higher (e.g., 1200 A) bus currents may be employed.

Continuing to refer to FIG. 6, the circuitry of the temperature sense printed circuit board 48 of FIG. 4 is shown. Each of the coils 8 includes a winding 63 which is electrically connected in series with the winding of the other coil. The series electrically connected coil windings 63 output a voltage. A suitable transient voltage suppressor 64 is electrically connected across the series combination of the power coils 8 in order to aid in handling relatively high voltage spikes for short durations and relatively low voltage spikes for relatively longer durations. The coil (alternating current (AC)) voltage 66 is input by a voltage quadrupler circuit 68 and, in turn, into two voltage regulators 70 and 72 providing a +5 VDC voltage 74 for a temperature circuit 75 and a +3.3 VDC voltage 76 for the radio transceiver daughter board 50 of FIG. 4. The example circuit 68 includes the four capacitors 56 and four diodes 78 that provide energy storage and rectification, although a wide range of suitable protection and multiplication circuits may be employed.

The temperature circuit 75 includes the temperature sensor 44 and a buffer amplifier 80. The radio transceiver daughter board 50 is adapted to transmit (and/or receive) a wireless signal 82 through a suitable antenna circuit 84. The antenna circuit 84 includes the connector 62, the conductive trace 58 and a suitable matching circuit 86.

The daughter board 50 includes a suitable processor, such as a microprocessor (μP) 88, which inputs the sensed temperature characteristic 90 from the temperature circuit 75 and outputs the corresponding wireless signal 82.

As is discussed below in connection with FIGS. 7–10, power savings may be provided by employing a relatively efficient wireless communication board and/or by employing a processor including appropriate sleep (e.g., low-power) and wake up modes.

EXAMPLE 11

As a non-limiting example, the temperature circuit 75 draws about 5 mA from the +5 VDC voltage 74 and the radio transceiver daughter board 50 draws 40 mA during wireless transmission and 50 mA during reception in which peak power may be supplied by capacitors, such as 56, in the power supply 24 during these relatively short durations of time. Otherwise, the radio transceiver is preferably turned off.

EXAMPLE 12

Figure 7:
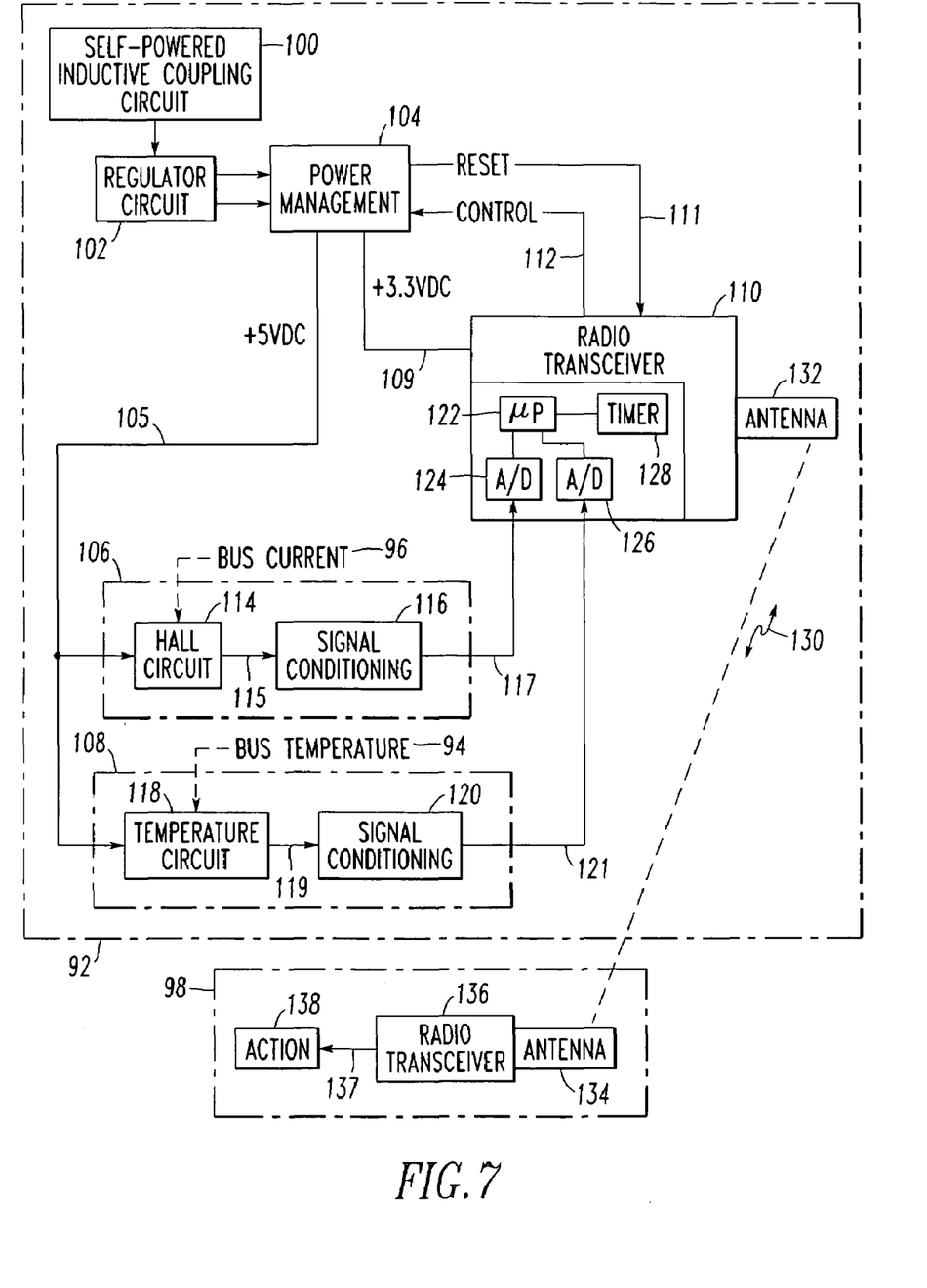
FIG. 7 is a block diagram of another wireless power bus sensor for measuring bus temperature and bus current in accordance with another embodiment of the invention.

FIG. 7 shows another stand-alone wireless power bus sensor 92 for measuring a characteristic of a power bus, such as bus temperature 94 and/or bus current flow 96. The self-powered sensor 92 is independently coupled to a power bus, such as the power bus bar 4 of FIG. 1, and wirelessly communicates the sensed bus temperature 94 and/or the sensed bus current flow 96 to a remote device 98 at a suitable time interval (e.g., without limitation, every few seconds; every few minutes).

The sensor 92 includes a suitable self-powered inductive coupling circuit 100 and a regulator circuit 102 that may function in a similar manner as the power supply 24 of FIGS. 1 and 6. In addition, a power management circuit 104 may be employed to provide the additional functions of: (1) managing a +5 VDC voltage 105 to a current sensing circuit 106 and a temperature sensing circuit 108; (2) managing a +3.3 VDC voltage 109 to a radio transceiver circuit 110; (3)

providing a power on reset signal 111 to the radio transceiver circuit 110 whenever the voltages from the regulator circuit 102 are initially established; and/or (4) circuit deactivation to minimize power consumption.

For example, if a control signal 112 from the radio transceiver circuit 110 is set to one state (e.g., true), then the power management circuit 104 outputs the normal voltages 105 and 109 to the respective circuits 106,108 and 110. Otherwise, the voltage 105 is disabled and the voltage 109 is reduced to a suitable sleep-mode voltage (e.g., without limitation, about 1.0 VDC). In this manner, power harvesting is continuously occurring in order to maintain the charge on the local power supply (e.g., capacitors (not shown)).

Preferably, as is discussed below in connection with FIGS. 8–10, suitable power management routines are employed to help save power consumption by putting the microprocessor 122 into a sleep (e.g., low-power) mode and waking up when data is to be sent. As a result, this may allow the sensor 92 to self-power at relatively lower bus currents.

EXAMPLE 13

The bus current flow 96 is measured by a suitable current sensor 114 of the current sensing circuit 106. For example, the current in the power bus is measured with one or two appropriately placed Hall sensors (not shown) to measure flux density near the power bus. A flux density signal 115 is suitably conditioned by a signal conditioning circuit 116 and is input at 117 by the radio transceiver 110.

EXAMPLE 14

The bus temperature 94 is measured by a suitable temperature circuit 118 of the temperature sensing circuit 108. The circuit 118 and its signal conditioning circuit 120 may be the same as or similar to the sensors as discussed above in connection with Example 2 and FIG. 6. A temperature signal 119 is suitably conditioned by the signal conditioning circuit 120 and is input at 121 by the radio transceiver 110.

Continuing to refer to FIG. 7, the radio transceiver 110 includes a suitable processor, such as a microprocessor (μP) 122, two analog-to-digital (A/D) converters 124 and 126, which include the respective inputs 117 and 121, and a timer 128, which is adapted to interrupt the processor 122 to wake up from its low-power mode. After initialization (e.g., startup), the microprocessor 122 enters a low power mode. The current and temperature signals at the inputs 117,121 are converted by the A/D converters 124,126, respectively, to corresponding digital signals and are transmitted by the radio transceiver 110 as a wireless signal, such as a low-rate wireless signal 130, from the antenna 132.

EXAMPLE 15

For example, the signal 130 is sent every few minutes in order to conserve power from the regulator circuit 102.

EXAMPLE 16

The remote device 98 receives the wireless signal 130 through antenna 134 to a corresponding radio transceiver 136, which, in turn, outputs a signal 137 to take a corresponding action 138.

EXAMPLE 17

The action 138 may be a display action adapted to display the sensed characteristic of the power bus.

EXAMPLE 18

The action 138 may be a flag (e.g., alarm) action adapted to alarm the sensed characteristic of the power bus.

EXAMPLE 19

The action 138 may be a wellness action adapted to determine the health of the power bus based upon the sensed characteristic thereof. As a non-limiting example, a suitable diagnostic algorithm, a suitable data mining algorithm or a look-up table (not shown) may be employed to make a calculation on the health of the power bus bar 4 or corresponding switchgear system (not shown) based on recorded historical (e.g., trend) data or known parameters of operation.

EXAMPLE 20

The action 138 may be a trip action adapted to trip a switchgear device (not shown) based upon the sensed characteristic of the power bus.

Figure 8:
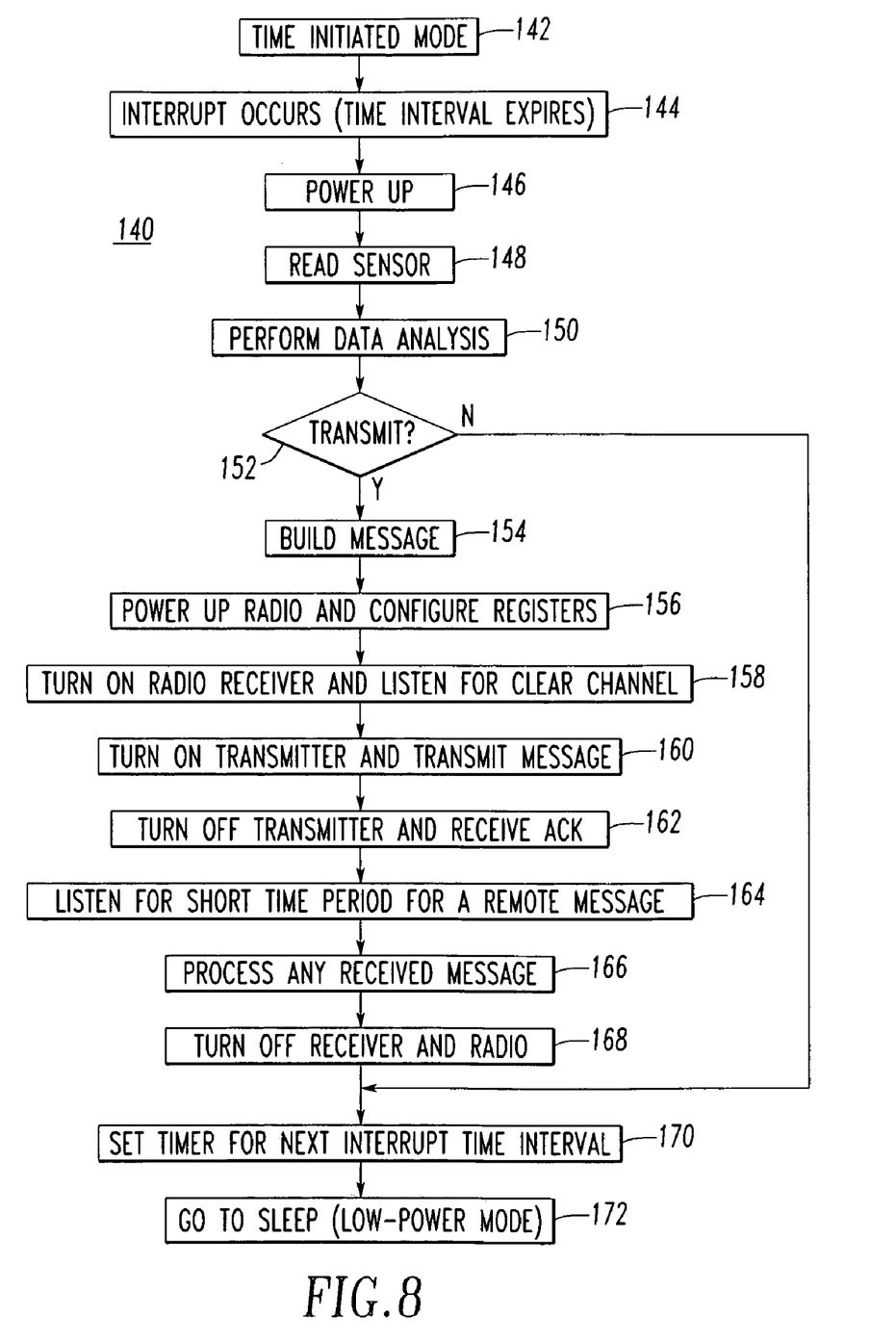
FIGS. 8–10 are flowcharts of software executed by the processor of FIG. 7 in accordance with other embodiments of the invention.

FIG. 8 shows a software routine 140 executed by the microprocessor 122 of FIG. 7, although the same or similar routine may be employed by the microprocessor 88 of FIG. 6. The microprocessor 122 includes a low-power mode and the routine 140 is adapted to wake up from that low-power mode, input the sensed characteristic(s) of the power bus (e.g., the power bus bar 4 of FIG. 1), to prepare a message to output as the corresponding wireless signal 130 of FIG. 7, and, then, to sleep in the low-power mode.

The time initiated mode 142 begins, at 144, when an interrupt to the microprocessor 122 of FIG. 7 occurs after the time interval of the timer 128 expires. In response, at 146, the microprocessor 122 wakes up from the low-power mode. Next, at 148, the sensed characteristic(s) of the power bus is (are) read (e.g., from the A/D converters 124,126). Then, at 150, suitable data analysis may be performed on the sensed bus characteristic(s). For example, the raw sensor data may be converted to temperature (e.g., ° C.; ° F.) values or current (e.g., A) values and/or the state of health of the power bus may be performed based on a suitable diagnostic algorithm (not shown) and historic data collection and/or the temperature or current values may be compared to preset limit values (not shown). Next, at 152, a decision is made whether to transmit. For example, this decision could always be yes (e.g., the duty cycle for the low-power sleep mode versus transmitting a message is low enough in order that power consumption is less than the total power harvested between interrupt intervals), could be based upon the magnitude of change or the value of the bus characteristic(s), and/or could be based upon whether sufficient power supply voltage is present. If not, then execution resumes at 170. Otherwise, execution resumes at 154, which builds a suitable message frame (not shown) for transmission. Then, at 156, the microprocessor 122 powers up the radio (not shown) of the radio transceiver 110 and configures the registers (not shown) thereof. Next, at 158, the radio receiver (not shown) is turned on and a suitable clear channel is awaited. Then, at 160, the radio transmitter (not shown) is turned on and the message frame is transmitted as the wireless signal 130. Next, at 162, the radio transmitter is turned off and an acknowledge message (not shown) is received from the recipient of that wireless signal 130. Next, at 164, the radio receiver is checked for any remote message (not shown), which, if received, is processed at 166. Then, at 168, the radio receiver and the radio are turned off. Next, at 170, the timer 128 is reset for the next interrupt time interval. Finally, at 172, the microprocessor 122 powers down and enters the low-power sleep mode.

Figure 9:
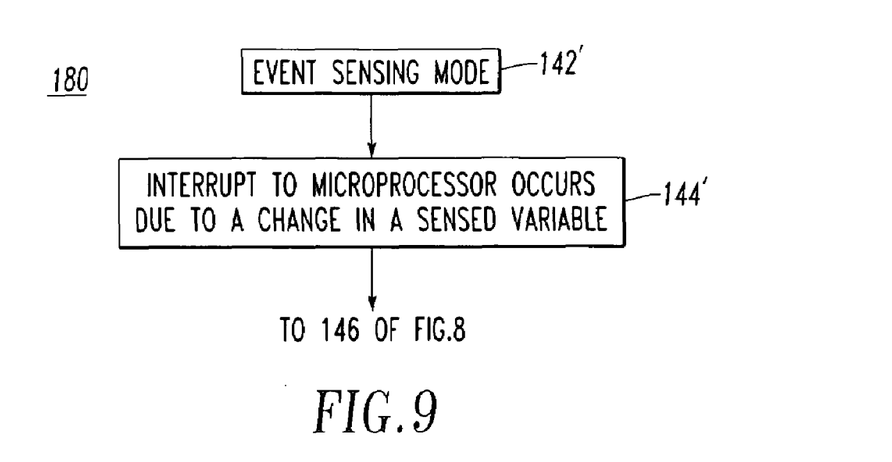

FIG. 9 shows a software routine 180 executed by the microprocessor 122 of FIG. 7, although the same or similar routine may be employed by the microprocessor 88 of FIG. 6. The microprocessor 122 includes an event sensing mode 142' that initiates the interrupt of step 144 of FIG. 8 instead of the timer 128, which need not be employed. At 144', the interrupt to microprocessor 122 occurs as a result of a suitably significant change (Δ) in a sensed variable (e.g., Δ temperature from the temperature sensing circuit 108; Δ current from the current sensing circuit 106; Δ sensed variable from any suitable bus characteristic sensor; Δ power supply voltage from the regulator circuit 102. Thus, a significant change in one or more of the sensed bus characteristic(s) or a significant increase of the power supply voltage(s) may trigger the transmission of the wireless signal 130. For example, these changes may be determined by one or more of the circuits 104,116,120 and may be input by the microprocessor 122 on one or more interrupt lines (not shown). Regardless, this causes the microprocessor 122 to wake up and power up as was discussed above in connection with step 146 of FIG. 8. Execution is otherwise similar to even steps 146–172 of FIG. 8 except that steps 152 and 170 are not employed.

Preferably, one of the routines 140 of FIG. 8 and 180 of FIG. 9 is employed to provide relatively low power consumption from the regulator circuit 102 of FIG. 7.

Figure 10:
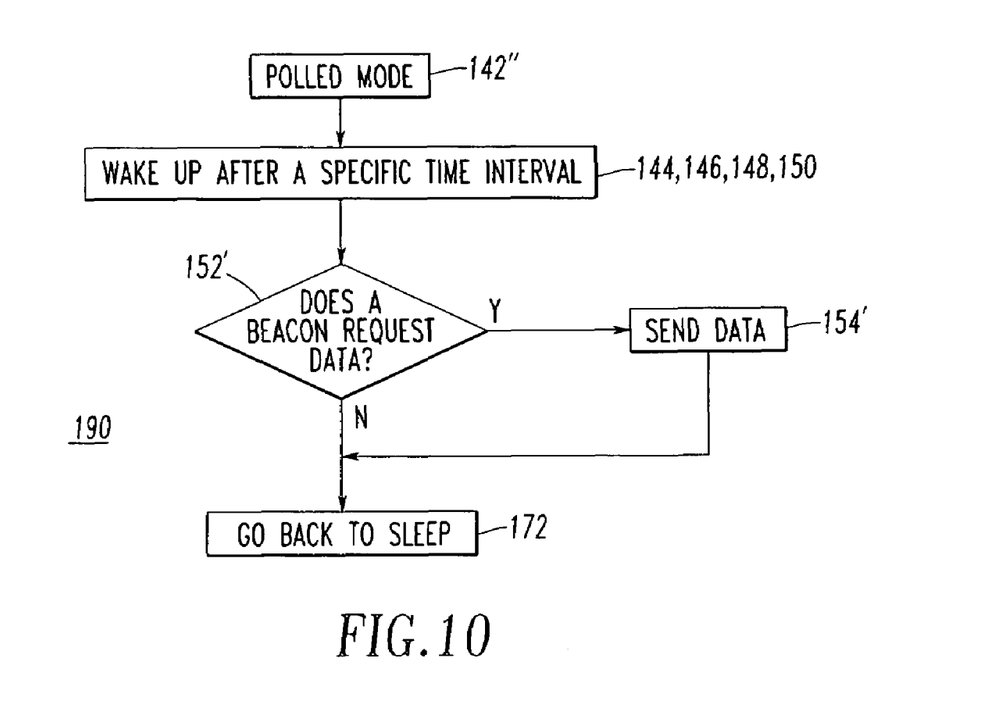

FIG. 10 shows a software routine 190 executed by the microprocessor 122 of FIG. 7, although the same or similar routine may be employed by the microprocessor 88 of FIG. 6. The microprocessor 122 includes a polled mode 142" that includes even steps 144,146,148,150 of FIG. 8 that wake up after the predetermined time interval and read the sensed bus characteristic(s). However, no wireless signal is transmitted unless it is requested by a remote device (e.g., 98 of FIG. 7). Next, step 152' determines whether a received message, such as a beacon message (e.g., employed to trigger a response from another wireless device) requests data. For example, step 152' may include even steps 156,158,164,166,168 of FIG. 8 to receive the message and determine if it requests the transmission of the wireless signal 130. If so, at 154', which employs even steps 154,156,158,160,162 of FIG. 7, the wireless signal 130 is transmitted. Here, the routine 190 causes the microprocessor 122 to wake up after a specific time interval and to listen for a beacon requesting data before sending the wireless signal 130. Otherwise, if there was no request at 152', or after 154', the routine 190 goes back to sleep and checks for another beacon at the end of the next time interval.

Although the radio transceivers 50, 110 employ respective processors 88,122, it will be appreciated that a combination of one or more of analog, digital and/or processor-based circuits may be employed.

While for clarity of disclosure reference has been made herein to the exemplary display action 138 for displaying temperature, current or other sensor information, it will be appreciated that such information may be stored, printed on hard copy, be computer modified, or be combined with other data. All such processing shall be deemed to fall within the terms "display" or "displaying" as employed herein.

The disclosed sensor device 2 is relatively easy to install for new or retrofit applications, since it can be placed on a power bus bar 4.

While specific embodiments of the invention have been described in detail, it will be appreciated by those skilled in the art that various modifications and alternatives to those details could be developed in light of the overall teachings of the disclosure. Accordingly, the particular arrangements disclosed are meant to be illustrative only and not limiting as to the scope of the invention which is to be given the full breadth of the claims appended and any and all equivalents thereof.

What is claimed is:

1. A sensor apparatus for a power bus including a plurality of characteristics, said sensor apparatus comprising:
   a housing;
   at least one sensor, each of said at least one sensor being adapted to sense a characteristic of said power bus;
   a circuit adapted to at least transmit a wireless signal;
   a processor adapted to input the sensed characteristic from said at least one sensor and to output a corresponding signal to said circuit in order to transmit said wireless signal; and
   a power supply adapted to couple said housing to said power bus and to power said at least one sensor, said circuit and said processor from flux arising from current flowing in said power bus.

2. The sensor apparatus of claim 1 wherein said power supply comprises two coils each of which has an opening, a ferrite core having two ends, and a magnetic flux concentrator member having two ends, said ferrite core being passed through the openings of said coils, each of the ends of said magnetic flux concentrator member engaging a corresponding one of the ends of said ferrite core; and wherein said ferrite core and said magnetic flux concentrator member are adapted to encircle and capture said power bus.

3. The sensor apparatus of claim 2 wherein each of said coils includes a winding which is electrically connected in series with the winding of the other one of said coils, said series electrically connected windings of said coils outputting a first voltage; and wherein said power supply further comprises means for generating at least one second voltage from said first voltage to power said at least one sensor, said circuit and said processor.

4. The sensor apparatus of claim 2 wherein said power bus further includes a generally planar surface; and wherein said magnetic flux concentrator member is adapted to hold said coils against or proximate to the generally planar surface of said power bus.

5. The sensor apparatus of claim 4 wherein the generally planar surface of said power bus has a first end and an opposite second end; and wherein said power supply further comprises a spacer having an opening through which said ferrite core passes, said spacer being between said coils, each of said coils being adapted to be proximate one of the first end and the opposite second end of said generally planar surface.

6. The sensor apparatus of claim 1 wherein said processor comprises a low-power mode and a routine adapted to wake up from said low-power mode, to input said sensed characteristic of said power bus, to prepare a message to output as said corresponding signal to said circuit, and to sleep in said low-power mode.

7. The sensor apparatus of claim 6 wherein said processor further comprises a timer adapted to interrupt said processor to wake up from said low-power mode.

8. The sensor apparatus of claim 6 wherein said routine is further adapted to determine whether to output said message as said corresponding signal to said circuit based upon a predetermined change in said sensed characteristic of said power bus.

9. The sensor apparatus of claim 6 wherein said circuit is further adapted to transmit as said wireless signal a first wireless signal and to receive a second wireless signal; and wherein said routine is further adapted to process a received message from said received second wireless signal.

10. The sensor apparatus of claim 9 wherein said routine is further adapted to output a transmit message as said corresponding signal to said circuit in response to said received message.

11. The sensor apparatus of claim 6 wherein said power supply includes at least one voltage; and wherein said routine is adapted to interrupt said processor to wake up from said low-power mode in response to a predetermined change in said sensed characteristic of said power bus or a predetermined value of at least one of said at least one voltage.

12. The sensor apparatus of claim 1 wherein said at least one sensor is a single sensor; and wherein said housing encloses a first printed circuit board including said single sensor and also encloses a second printed circuit board including said circuit adapted to at least transmit a wireless signal.

13. The sensor apparatus of claim 12 wherein said second printed circuit board is a radio transceiver circuit board including an antenna output; wherein said circuit adapted to at least transmit a wireless signal comprises an antenna formed from a printed conductor on said first printed circuit board; and wherein said first printed circuit board comprises a connector electrically connecting said printed conductor to the antenna output of said radio transceiver circuit board.

14. The sensor apparatus of claim 1 wherein said characteristics of said power bus include a temperature of said power bus; and wherein said at least one sensor is a temperature sensor adapted to sense the temperature of said power bus.

15. The sensor apparatus of claim 1 wherein said characteristics of said power bus include a current flowing in said power bus; and wherein said at least one sensor comprises two Hall detectors adapted to sense said current.

16. The sensor apparatus of claim 1 wherein said circuit is adapted to transmit said wireless signal as a low-rate wireless communication.

17. The sensor apparatus of claim 1 wherein said wireless signal is adapted to trip a switchgear device.

18. The sensor apparatus of claim 1 wherein said wireless signal is adapted to alarm said sensed characteristic of said power bus.

19. The sensor apparatus of claim 1 wherein said wireless signal is adapted to display said sensed characteristic of said power bus.

20. The sensor apparatus of claim 1 wherein said housing is an insulated enclosure.

21. A sensor apparatus for a power bus including a plurality of characteristics, said sensor apparatus comprising:

a housing;

at least one sensor, each of said at least one sensor being adapted to sense a characteristic of said power bus;

a circuit adapted to at least transmit a wireless signal;

a processor adapted to input the sensed characteristic from said at least one sensor and to output a corresponding signal to said circuit in order to transmit said wireless signal; and a power supply adapted to power said at least one sensor, said circuit and said processor from flux arising from current flowing in said power bus, a portion of said power supply being adapted to engage and capture said power bus, and couple said housing to said power bus.

* * * * *